(12) United States Patent
Takahashi

(10) Patent No.: US 7,031,124 B2
(45) Date of Patent: Apr. 18, 2006

(54) SYNCHRONOUS SOFT-SHUTDOWN GATE DRIVE CIRCUIT

(75) Inventor: Toshio Takahashi, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 296 days.

(21) Appl. No.: 10/345,045

(22) Filed: Jan. 15, 2003

(65) Prior Publication Data
US 2004/0136135 A1     Jul. 15, 2004

(51) Int. Cl.
*H02H 9/08* (2006.01)

(52) U.S. Cl. ................................ 361/30; 361/93.9
(58) Field of Classification Search ............. 361/28, 361/30, 31, 86, 87, 91.1, 92, 93.7–93.9; 327/381, 327/423
See application file for complete search history.

(56) References Cited

U.S. PATENT DOCUMENTS

| | | | | |
|---|---|---|---|---|
| 5,309,888 A | * | 5/1994 | Deutsch et al. ............ | 123/609 |
| 6,188,210 B1 | * | 2/2001 | Tichauer et al. ........... | 323/273 |
| 6,832,356 B1 | * | 12/2004 | Ochi ........................... | 716/1 |
| 6,859,087 B1 | * | 2/2005 | Galli et al. ................. | 327/423 |

* cited by examiner

*Primary Examiner*—Brian Sircus
*Assistant Examiner*—Danny Nguyen
(74) *Attorney, Agent, or Firm*—Ostrolenk, Faber, Gerb & Soffen, LLP

(57) ABSTRACT

A soft-shutdown circuit for shutting down a power device driven by a gate drive signal applied to a gate of the device, wherein an over-current condition through the device is sensed and a soft-shutdown of the device is initiated upon sensing of the current condition. A latch circuit receives the gate drive signal, latches the gate drive signal upon receipt of a latching signal, and transfers the signal to the gate of the device upon release of the latching signal. The latching signal is sent to the latching circuit upon initiation of the soft-shutdown and is released after completion of the soft-shutdown. Preferably, identical soft-shutdown circuits are incorporated in each of the three gate drive circuits of an AC PWM inverter. Each soft-shutdown circuit includes a bi-direction soft-shutdown pin which, when a soft-shutdown is initiated in a first one of the gate drive circuits, sends a signal to the other gate drive circuits to initiate a soft-shutdown in those gate drive circuits. Similarly, any of the other gate drive circuits can send a signal to the bi-directional pin of the first gate drive circuit to initiate soft-shutdown thereof.

26 Claims, 5 Drawing Sheets

SYNCHRONOUS SOFT-SHUTDOWN GATE DRIVE CIRCUIT

BACKGROUND OF THE INVENTION

The present invention relates to soft-shutdown circuits and, more particularly, to soft-shutdown circuits used in gate drive circuits to provide over-current protection of loads, such as motors.

In motor drive applications, over-current protection is often required in order to protect the switching power devices employed from catastrophic destruction due to excess heat concentration of the devices. Complete protection circuit normally consists of sensing an over-current condition, reporting of the condition, and shutting down the gate drive circuit.

A soft-shutdown method is often preferred over a hard-shutdown method. This is primarily due to the fact that soft-shutdown results in less overshoot voltage across the switching devices since it limits the rate of change of short circuit current (di/dt). Even if the circuit has a parasitic inductance in the series path of the short-circuit current, this controlled di/dt will substantially reduce excess overshoot voltage across the switching devices.

However, during the soft-shutdown period, all other gate signals need to be unchanged in order to complete the soft-shutdown sequence. Otherwise, if any of the other gate signals, which carry large over-current in associated switching devices, turn off while soft-shutdown is in process, the soft-shutdown is aborted by a hard-shutoff of the other devices.

If the gate drive circuit uses multiple integrated circuits or discrete circuits to drive all of the power devices for AC motor drive application, typically six devices, implementation of a soft-shutdown scheme has proven to be difficult since each gate drive circuit needs to be synchronized with the others to ensure successful completion of the soft-shutdown process.

SUMMARY OF THE INVENTION

It is an object of the invention to provide a soft-shutdown circuit which prevents hard-shutdown until completion of the soft-shutdown process.

It is a further object of the present invention to provide a soft-shutdown arrangement which enables synchronization among a plurality of gate drive circuits.

These and other objects are achieved by a soft-shutdown circuit which includes: means for sensing an over-current condition through the device; means responsive to the over-current condition for initiating a soft-shutdown of the device; means including a latch circuit for receiving a gate drive signal, latching the gate drive signal upon receipt of a latching signal, and transferring such signal to the gate of the device upon release of the latching signal; and means responsive to the soft-shutdown initiating means for sending a latching signal to the latching circuit and for releasing the latching signal after completion of the soft-shutdown.

According to an aspect of the invention, a bi-directional pin is provided for sending a soft-shutdown signal to another soft-shutdown circuit to initiate a soft-shutdown in that circuit or for receiving a soft-shutdown signal from another circuit and initiating soft-shutdown in the first circuit.

In accordance with another aspect, a soft-shutdown circuit in accordance with the invention is incorporated in each gate drive circuit of an AC PWM (Pulse Width Modulated) inverter. If an over-current occurs in one power device, soft-shutdown is initiated in that device and all of the other power devices before transition into a hard-shutdown.

Other features and advantages of the present invention will become apparent from the following description of the invention which refers to the accompanying drawings.

BRIEF DESCRIPTIONS OF THE DRAWINGS

DETAILED DESCRIPTION OF THE PREFERRED EMBODIMENT(S)

In an AC PWM inverter system for controlling a motor, a line-to-line short circuit condition occurs when any two inverter terminal outputs are shorted by mis-wiring the motor lead cable, or when the motor phase-to-phase wire conductor insulation is deteriorated or when the motor lead cable insulation is deteriorated.

Figure 1:
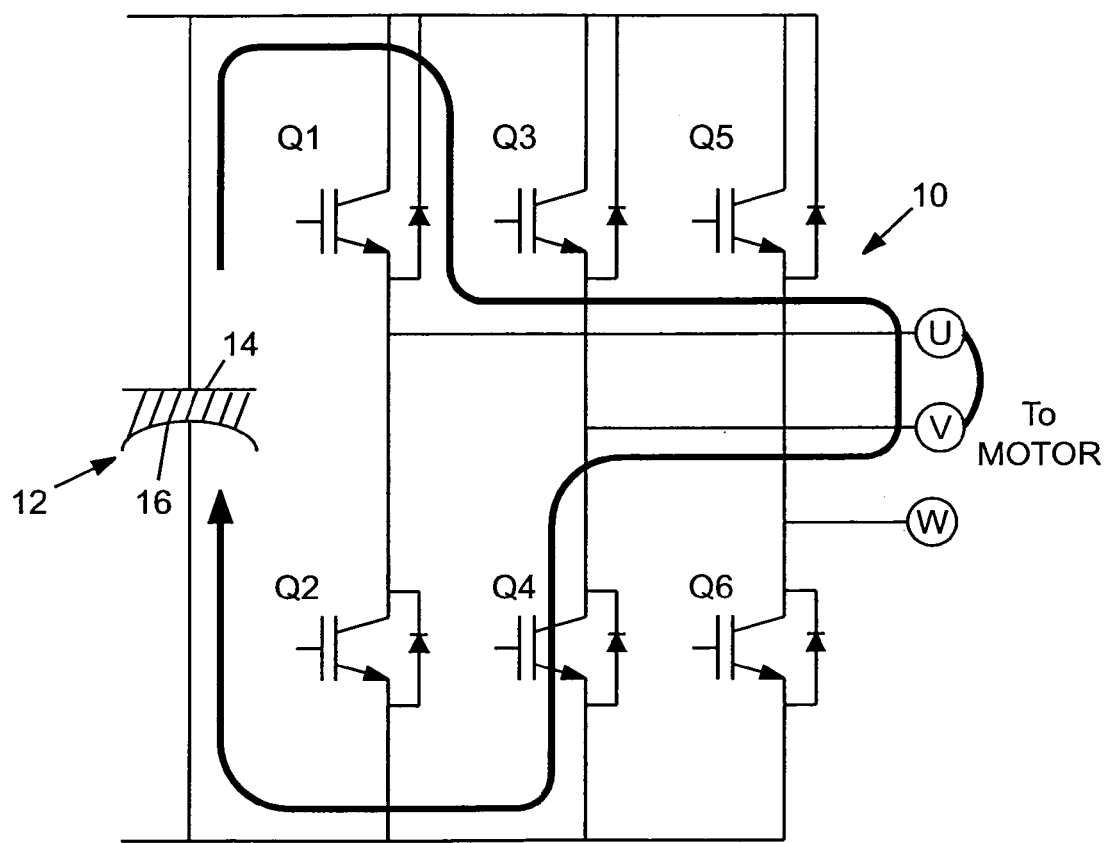
FIG. 1 illustrates a typical short circuit condition in a conventional PWM AC converter power circuit.

FIG. 1 shows a typical line-to-line short circuit condition in a PWM AC inverter power circuit 10 when the motor terminals, "U" and "V" are shorted. The circuit 10 includes six power transistors $Q_1$–$Q_6$ (e.g. IGBT or MOSFET) and a DC bus capacitor 12. The short circuit current flows in the PWM AC inverter power circuit 10 from the positive node 14 of the capacitor 12 to $Q_1$, to the terminal "U", to the terminal "V" to $Q_4$ and to the DC bus capacitor negative node 16. When such a line-to-line short circuit condition occurs, normally, the two power devices $Q_1$ and $Q_4$ carry an excess amount of current in series.

If either or both $Q_1$ and $Q_4$ are turned off without soft-shutdown, an unwanted excess overshoot voltage across the collector and emitter of the device being turned off appears. Excess overshoot voltage is inevitable if a parasitic inductance in series with the main current path exists in the power circuit. The overshoot voltage is proportional to the parasitic inductance multiplied by the rate of change of the current. The larger the parasitic inductance and the rate of change of current, the larger the overshoot voltage. This excess overshoot voltage combined with a large current due to the short circuit condition sometimes causes the device (e.g. either $Q_1$, $Q_4$ or both) to exceed its safe operating limit resulting in destruction of the device. This problem is further aggravated when the device current becomes large, such as in high power motor drive application.

Soft-shutdown in the event of over-current and a short circuit condition minimizes the excess overshoot voltage across the switching device since it reduces the rate of change of current during soft-shutdown period.

Figure 2:
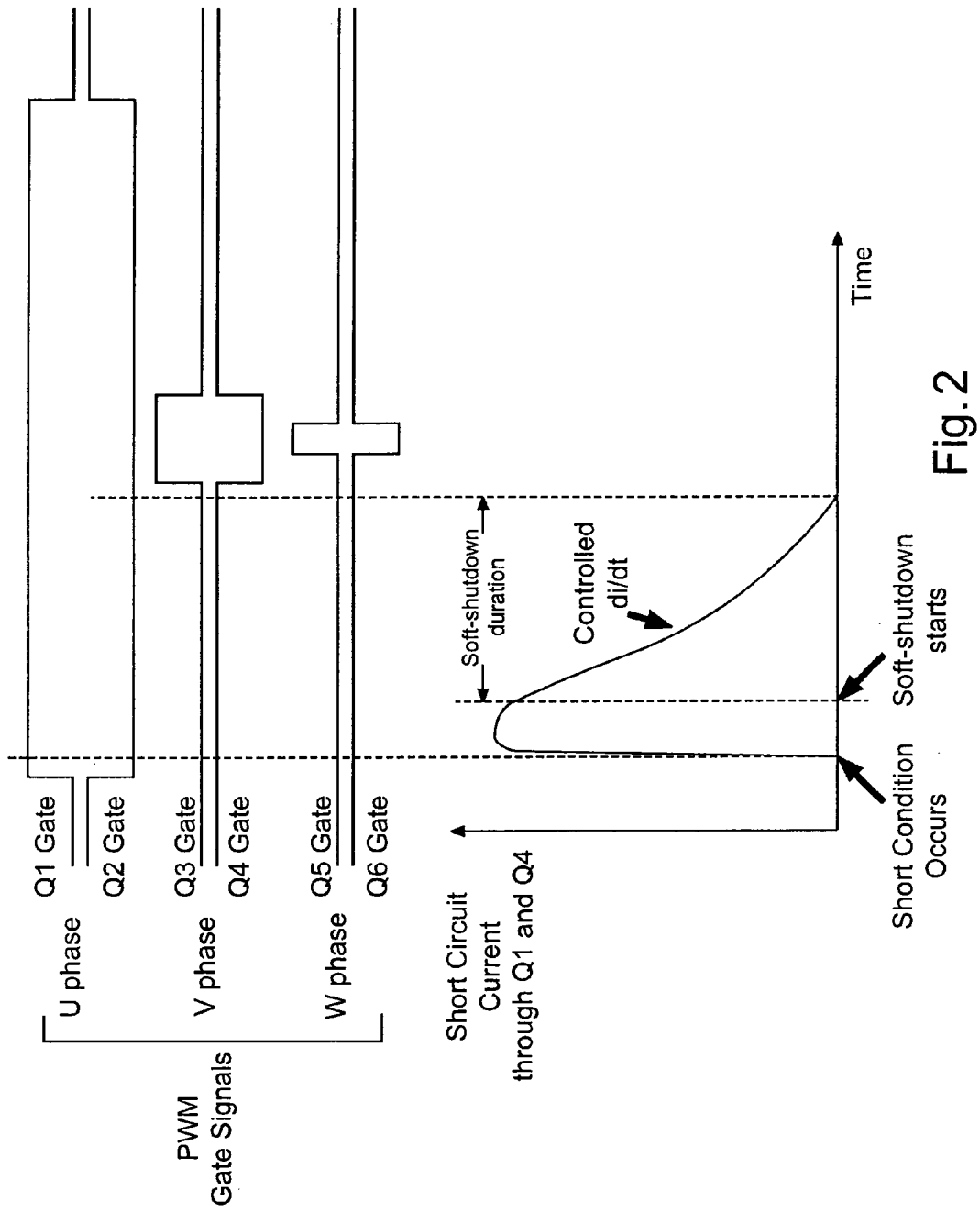
FIG. 2 shows an excess over-current through the power transistors of the circuit of FIG. 1 resulting from a short circuit condition and the PWM gate signals while an uninterrupted soft-shutdown is taking place.

FIG. 2 shows PWM gate signals and excess over current through $Q_1$ and $Q_4$ resulting from a short-circuit condition during soft-shutdown control. "U," "V" and "W" designate the respective phases of the three-phases of the motor (not shown) being controlled.

When a short circuit condition occurs, excess current first reaches the saturation level of the power devices $Q_1$ and $Q_4$. Then the short circuit current is sensed and a soft-shutdown process is initiated.

In the case shown in FIG. 2, the PWM gate signals are not altered during the soft-shutdown process. As a result, the soft-shutdown process continues uninterrupted until the end of the soft shut-down period.

Figure 3:
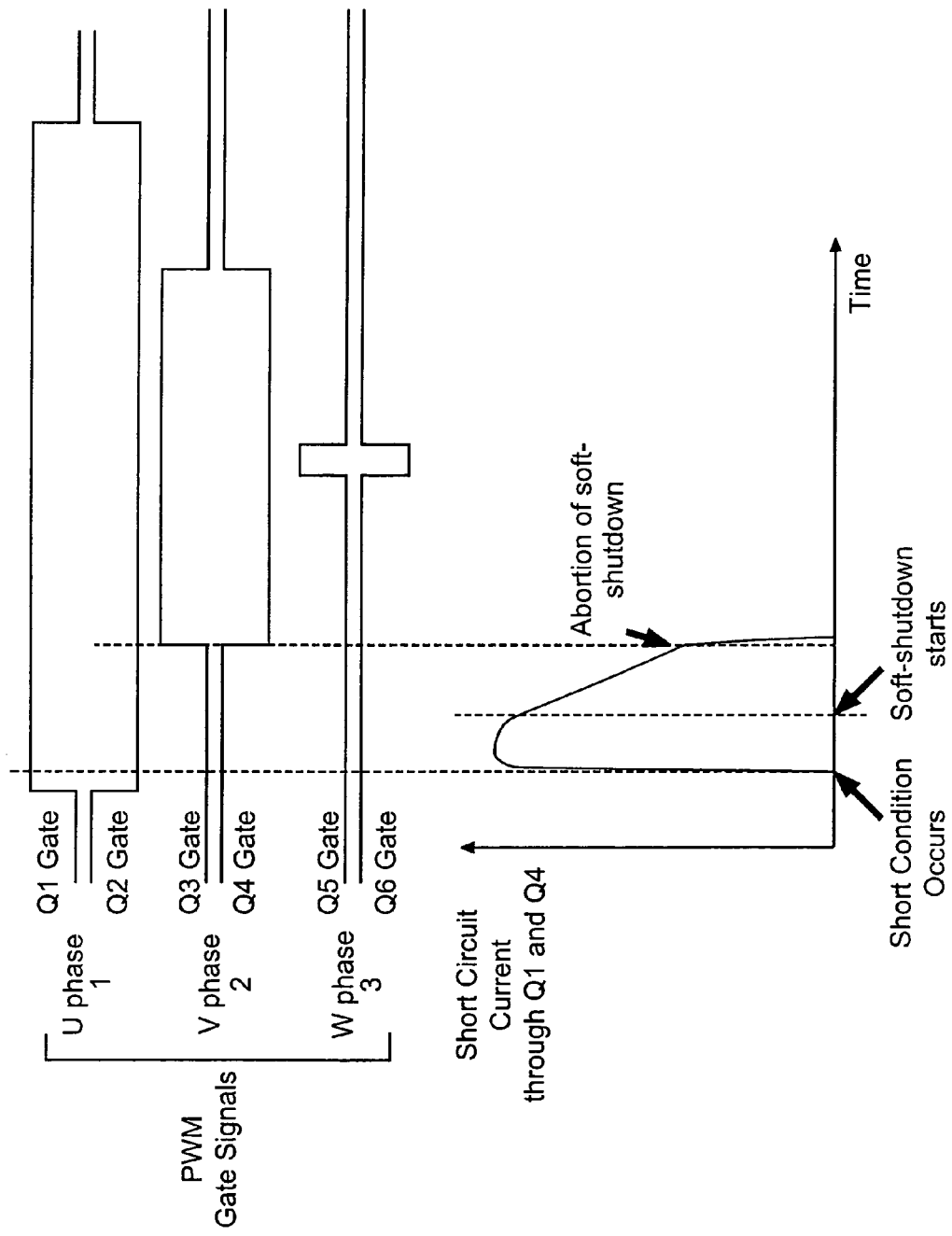
FIG. 3 shows the excess over-current through the power transistors of the circuit of FIG. 1 resulting from a short circuit condition and the PWM gate signals when the soft-shutdown process is aborted.

If, as shown in FIG. 3, any of the PWM gate signals, such as the $Q_3$ gate signal, changes, the soft-shutdown process is aborted and effectively turns into a hard-shutdown condition. Therefore, if the circuit has a large enough parasitic inductance in series with the short circuit path, the resulting excess overshoot voltage across the power devices, $Q_1$ and $Q_4$, could be large and potentially damage the power devices.

This condition occurs in a typical motor drive system because the PWM gate signal generation circuit is a separate circuit from the over-current detection circuit and gate drive circuit.

Traditionally, PWM gate signals are generated by a digital motor control system, such as a microcontroller or a DSP (Digital Signal Processor) or a custom designed ASIC (Application Specific Integrated Circuit). The PWM gate signals are logic level signals which are transferred to the gate drive circuit to produce the appropriate voltage level to the interfacing power devices through level shifting. There is no intelligence in a traditional gate drive circuit to dynamically alter the PWM gate signal. Especially if a gate drive circuit is implemented by multiple driver integrated circuits or separate discrete circuits, it is difficult to sense the over-current condition cohesively and engage in a synchronous soft-shutdown process.

Figure 4:
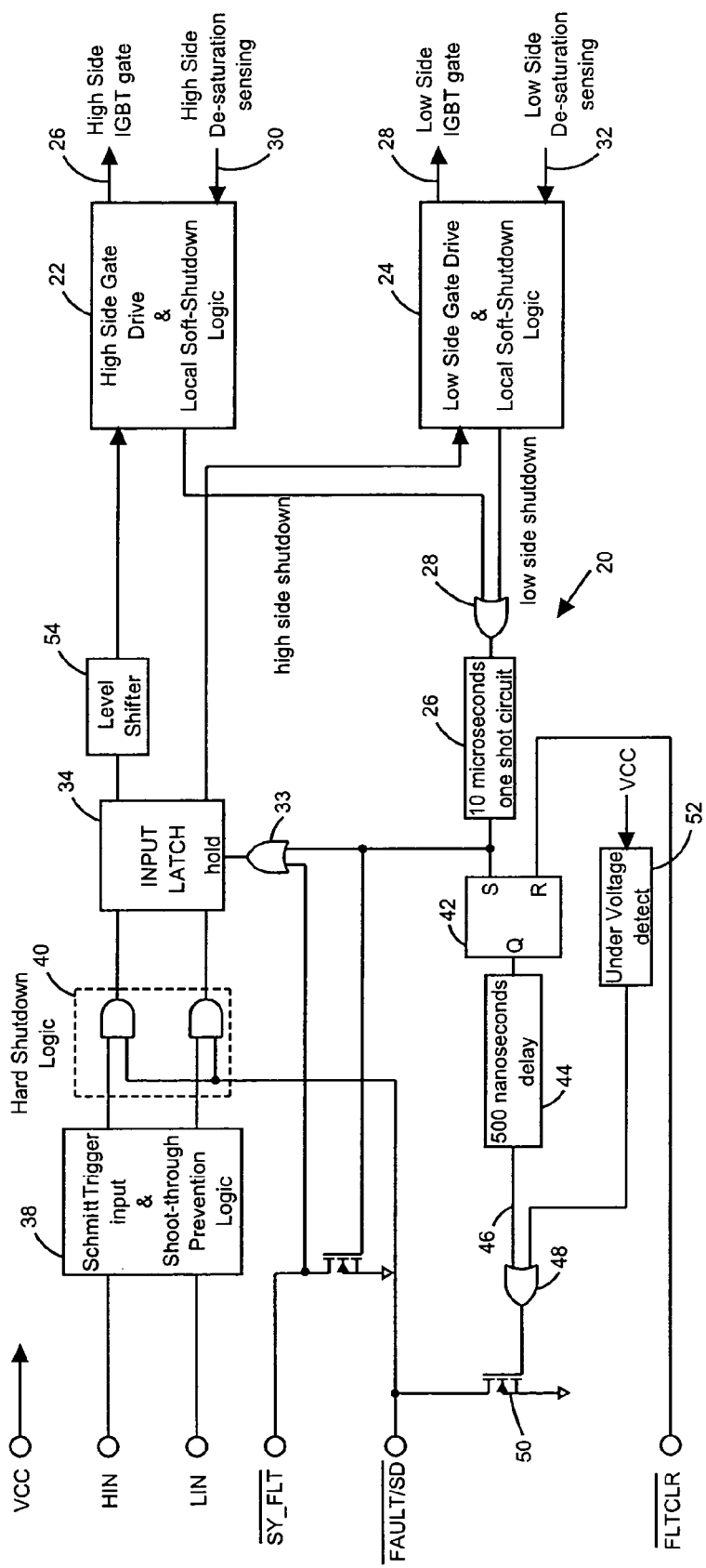
FIG. 4 shows a soft-shutdown processing circuit illustrating certain features of the invention.
Figure 5:
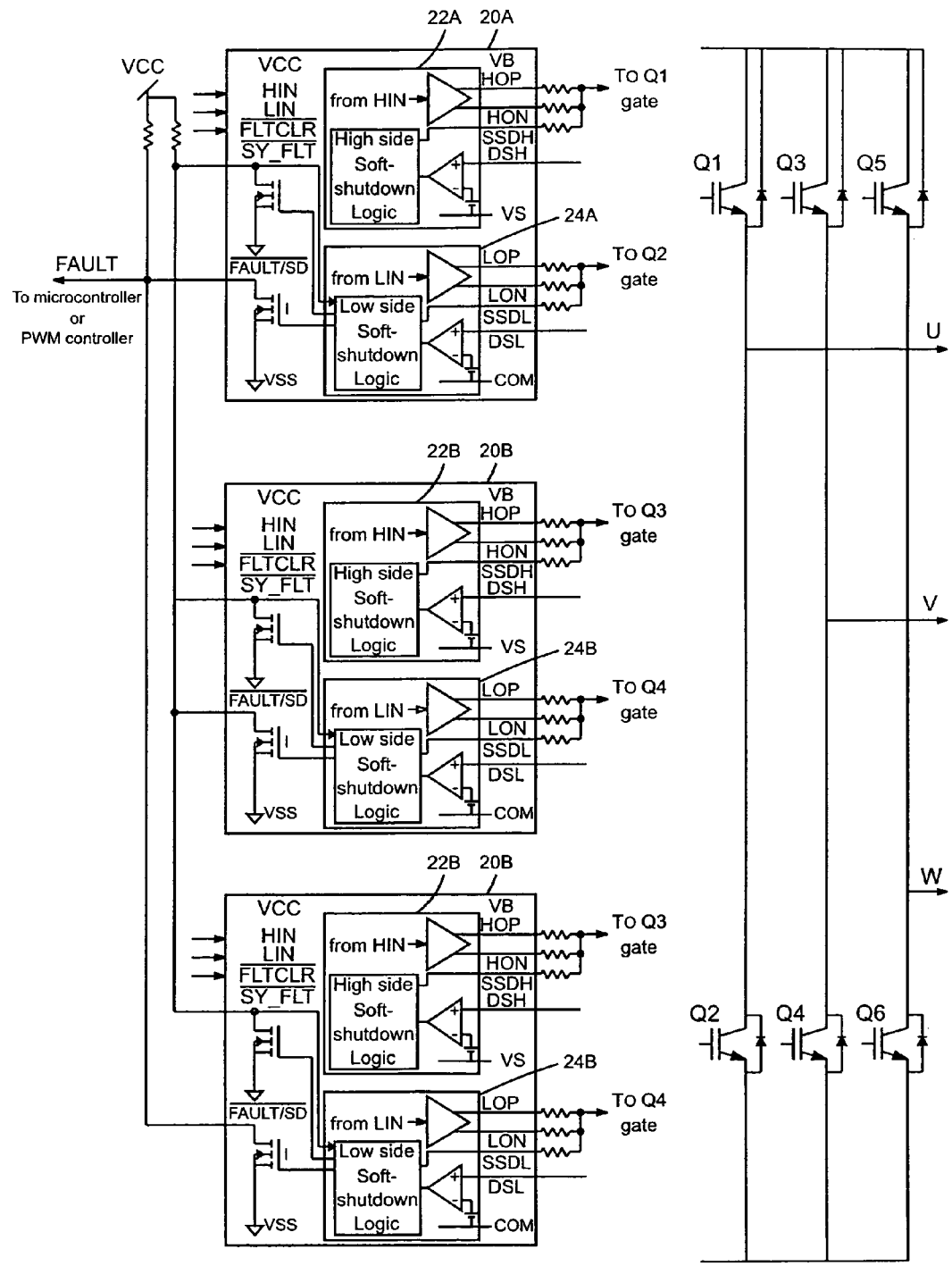
FIG. 5 illustrates a plurality of gate drive circuits incorporating the soft-shutdown circuit of FIG. 4.

FIG. 4 shows a soft-shutdown processor circuit illustrating certain features of the invention and FIG. 5 illustrates a plurality of gate drive circuits incorporating the soft-shutdown circuit of FIG. 4.

The definitions of the symbols used in FIGS. 4 and 5 are set forth in the following table.

Definitions

| Symbol | Description |
| --- | --- |
| VCC | Low side and logic fixed supply |
| VSS | Logic Ground |
| HIN 1, 2, 3 | Logic inputs for high side gate driver outputs (HO 1, 2, 3) |
| LIN 1, 2, 3 | Logic inputs for low side gate driver outputs (LO 1, 2, 3) |
| FAULT/SD | Indicates over-current or low-side undervoltage has occurred. |
| SY_FLT | Indicates soft-shutdown has occurred. |
| FLT CLR | Clear signal |
| COM | Low side gate driver return |
| $V_B$ 1, 2, 3 | High side floating supply |
| HOP 1, 2, 3 | High side gate driver turn on signal |
| $V_s$ 1, 2, 3 | High voltage floating supply returns |
| LOP 1, 2, 3 | Low side gate driver turn on signal |
| SSDH 1, 2, 3 | Soft-shutdown activation signal |
| DSH 1, 2, 3 | High side desaturation signal |
| DSH 1, 2, 3 | Low side desaturation signal |
| HON 1, 2, 3 | High side gate turn OFF signal |
| LON 1, 2, 3 | Low side gate turn OFF signal |
| U, V, W | Motor phases |
| $Q_1$–$Q_6$ | Power devices |

Turning first to FIG. 4, there is shown a soft-shutdown circuit 20 in accordance with the present invention which alleviates premature termination of the soft-shutdown process. Advantageously, the soft-shutdown circuit 20 is implemented in a half-bridge gate drive integrated circuit, such as the International Rectifier IR2214.

The soft-shutdown circuit 20 includes a high side gate drive and local logic circuit 22 and a low side gate drive and local logic circuit 24, which output gate drive signals 26, 28 and also receive, when there is an over current condition, a de-saturation sensing signal DSH from a de-saturation sensing circuit (not shown).

When an over-current condition is detected, either in the high side gate drive and local soft-shutdown logic circuit 22 or the low side gate drive and local soft-shutdown logic circuit 24, a pulse signal is generated by the high side gate drive and local soft-shutdown circuit 22 or the low side gate drive and local soft-shutdown circuit 24. The pulse is transmitted to a one-shot circuit 26 via an OR gate 28 to extend the pulse period sufficiently to cover the complete soft-shutdown period, typically 10 microseconds. This stretched pulse signal is sent via an OR gate 33 to a latch circuit 34 for holding incoming PWM signals and to a switching transistor 36 which drives the pin SY_FLT to signal an over-current condition. The activation period of SY_FLT is controlled by the one-shot pulse generation circuit 26 and, therefore, lasts ten microseconds. Once activated, the latch circuit 34 holds incoming input gate signals, HIN and LIN, while SY_FLT is activated.

The HIN and LIN signals are sent to the input latch circuit 34 after passing through a schmitt trigger input and shoot-through prevention logic circuit 38 which functions to condition the incoming signals to alleviate a slow transition or a noisy signal and to eliminate illegal logic states, such as turning on both high and low side switches. After passing through the Schmitt Trigger Input and Shoot-through Prevention Circuit 38, the HIN and LIN signals are also sent to a hard-shutdown logic circuit 40 which functions to generate immediate turn-off of both high and low side gate signals by AND gates.

During the activation period of SY_FLT, the state of the gate drive output signals 26, 28 are maintained by the latch circuit 34 regardless of any potential transition of the HIN and/or LIN input signals.

The output of the one shot circuit 26 also goes to an S-R flip-flop 42 to set a fault signal 46, with a 500 nanoseconds delay provided by a delay circuit 44. A 500 nanoseconds delay is required to insure that the input latch logic is able to hold the state of the gate signals 26, 28 before hard-shutdown takes place. The delayed fault signal 46 goes to the hard-shutdown logic circuit 46 through an OR gate 48 and a switching transistor 50 to turn off the incoming gate signal input. The fault signal 41 also drives a FAULT/SD pin through the OR gate 48 and the transistor 50. The other input to the OR gate 48 is from an under voltage detector 52 which outputs a fault signal when the VCC power supply voltage goes below the fixed under voltage threshold level.

After ten microseconds of soft-shutdown, i.e., the duration of the one-shot pulse, the latch 34 is released and the gate input signals HIN, LIN are then sent to the high side and low side gate drive and local soft-shutdown circuits 22, 24. A level shifter 54 is provided to change the level of the high side gate signal. The power transistors driven by the high side and low side gate drive and local shutdown circuits 22, 24, then automatically transition into a hard-shutdown state from a soft-shutdown state. Since during soft-shutdown the power is weakly pulled down through to relatively high ON state impedance, a false turn ON may be induced due to noise in the system. This automatic transition from soft-shutdown to hard-shutdown prevents the power switching devices from any unwanted false turn ON.

The signal sent to the $\overline{\text{SY\_FLT}}$ pin signals a soft-shutdown to other gate drive circuits, as will be discussed below in more detail. Similarly, if another gate drive circuit goes through a soft-shutdown, its soft-shutdown circuit will send a signal to its $\overline{\text{SY\_FLT}}$ pin which is then sent to the $\overline{\text{SY\_FLT}}$ pins of the other gate drive circuits. This signal will then be applied to the input latches 34 of the circuits through the OR gates 33 to hold the gate drive signals of the other gate drive circuits.

The interaction between the several gate drive circuits can be better understood by referring to FIG. 5.

FIG. 5 shows an AC PWM inverter 56 with three integrated gate drive circuits 20A, 20B, 20C, one for each of the windings U, V and W of a three phase motor (not shown). Each of the drive circuits 20A, 20B and 20C is identical to the circuit 20 of FIG. 4. In the case of a short-circuit condition, such as that described in FIG. 1 and FIG. 2, either the high side gate drive circuit 22A of the gate drive circuit 20A for $Q_1$ or the low side gate drive circuit 24C of the gate drive circuit 20C for $Q_4$ senses an over-current condition through its collector-to-emitter de-saturation detection circuit (not shown) which outputs a de-saturating signal DSH. The gate drive circuit 20A or 20C activates the bi-directional signal pin, $\overline{\text{SY\_FLT}}$, to signal an over-current condition to the other gate circuit (i.e. 20B and 20C when 20A activates the signal, or 20A and 20B when 20C activates the signal), and initiates soft-shutdown at the same time for the drive circuit in which de-saturation was sensed.

The other gate drive circuits which receive the over-current condition signal then hold their incoming PWM signals for the complete duration of the soft-shutdown process in order to avoid premature abortion of soft-shutdown even if a receiving PWM signal is changed. After soft-shutdown all of the circuits then transition into hard-shutdown.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A soft-shutdown circuit for shutting down a power device driven by a gate drive signal applied to a gate of the device, which circuit comprises:
    means for sensing an over-current condition through the device;
    means responsive to the over-current condition for initiating a soft-shutdown of the device;
    means including a latch circuit for receiving a gate drive signal, latching said gate drive signal upon receipt of a latching signal, and transferring such signal to the gate of the device upon release of the latching signal; and
    means responsive to the soft-shutdown initiating means for sending a latching signal to the latching circuit and for releasing the latching signal after completion of the soft-shutdown, wherein the gate drive signal is transferred to the gate of the device to initiate a hard shutdown of the device.

2. A soft-shutdown circuit as in claim 1, further including a level shifter for shifting the level of the signal transferred to the gate of the device.

3. A soft-shutdown circuit as in claim 1, wherein the means for sending and releasing the latching signal includes delay means for delaying the release of the latching signal for a period sufficient to fully complete the soft-shutdown.

4. A soft-shutdown circuit as in claim 3, wherein the delay means includes a one-shot circuit.

5. A soft-shutdown circuit as in claim 4, wherein the latching signal is sent to the latch circuit and to a soft-shutdown terminal.

6. A soft-shutdown circuit as in claim 1, further including an OR gate having first and second inputs and an output, the output being connected to the latching circuit and the first and second inputs being connected respectively to the means responsive to the initiating means and to a soft-shutdown terminal so that the latching circuit is operative to latch the gate drive signal upon receiving either a signal from the soft-shutdown terminal or from the means responsive to the initiating means.

7. A soft-shutdown circuit as in claim 6, wherein the initiating means sends the latching signal to the latching circuit and to a switching device connected to the soft-shutdown terminal.

8. A soft-shutdown circuit as in claim 7, further including a hard-shutdown logic circuit and wherein the hard-shutdown initiating means includes an S-R flip-flop, the output of which is sent to the hard-shutdown circuit.

9. A soft-shutdown circuit as in claim 8, wherein a delay circuit is provided to delay the output of the S-R flip-flop to the hard-shutdown logic circuit.

10. A soft-shutdown circuit as in claim 9, wherein the coupling between the delay circuit and the hard-shutdown circuit includes an OR gate having the delay circuit connected to one of its inputs and having its output connected to the hard-shutdown logic circuit and to a fault terminal.

11. A soft-shutdown circuit as in claim 10, wherein the fault terminal is connected to the hard-shutdown logic circuit so that hard-shutdown may be initiated either from a signal from the delay line through the OR gate or from a signal applied directly to the fault terminal.

12. A soft-shutdown circuit as in claim 11, wherein the output of the OR gate is connected to the hard-shutdown logic circuit and to the fault terminal through a switching transistor.

13. A soft-shutdown circuit as in claim 8, including an under-voltage detection circuit connected to another input of the OR gate so that hard-shutdown logic may be initiated upon detection of an under-voltage.

14. An arrangement for synchronous soft-shutdown of a plurality of gate drive circuits which comprises a plurality of soft-shutdown processing circuits, one for each gate drive circuit, each soft-shutdown circuit comprising:
    means for sensing an over-current condition through the device;
    means responsive to the over-current condition for initiating a soft-shutdown of the device;
    means including a latch circuit for receiving a gate drive signal, latching said gate drive signal upon receipt of a latching signal, and transferring such signal to the gate of the device upon release of the latching signal; and
    means responsive to the soft-shutdown initiating means for sending a latching signal to the latching circuit and for releasing the latching signal after completion of the soft-shutdown, wherein the gate drive signal is transferred to the gate of the device to initiate a hard shutdown of the device.

15. An arrangement as in claim 14, further including a level shifter for shifting the level of the signal transferred to the gate of the device.

16. An arrangement as in claim 14, wherein in each soft-shutdown circuit the means for sending and releasing the latching signal includes delay means for delaying the release of the latching signal for a period sufficient to fully complete the soft-shutdown.

17. An arrangement as in claim 16, wherein in each soft-shutdown circuit the delay means includes a one-shot circuit.

18. An arrangement as in claim 17, wherein in each soft-shutdown circuit the latching signal is sent to the latch circuit and to a soft-shutdown terminal.

19. An arrangement as in claim 14, wherein each soft-shutdown circuit further includes an OR gate having first and second inputs and an output, the output being connected to the latching circuit and the first and second inputs being connected respectively to the means responsive to the initiating means and to a soft-shutdown terminal so that the latching circuit is operative to latch the gate drive signal upon receiving either a signal from another one of the soft-shutdown circuits applied to the soft-shutdown terminal or from the means responsive to the initiating means.

20. An arrangement as in claim 19, wherein in each soft-shutdown circuit the initiating means sends the latching signal to the latching circuit and to a switching device connected to the soft-shutdown terminal.

21. An arrangement as in claim 20, wherein each soft-shutdown circuit further includes a hard-shutdown logic circuit and wherein the hard-shutdown initiating means includes an S-R flip-flop, the output of which is sent to the hard-shutdown circuit.

22. An arrangement as in claim 21, wherein in each soft-shutdown circuit a delay circuit is provided to delay the output of the S-R flip-flop to the hard-shutdown logic circuit.

23. An arrangement as in claim 22, wherein in each soft-shutdown circuit the coupling between the delay circuit and the hard-shutdown circuit includes an OR gate having the delay circuit connected to one of its inputs and having its output connected to the hard-shutdown logic circuit and to a fault terminal.

24. An arrangement as in claim 23, wherein in each soft-shutdown circuit the fault terminal is connected to the hard-shutdown logic circuit so that hard-shutdown may be initiated either from a signal from the delay line through the OR gate or from a signal applied directly to the fault terminal.

25. An arrangement as in claim 24, wherein in each soft-shutdown circuit the output of the OR gate is connected to the hard-shutdown logic circuit and to the fault terminal through a switching transistor.

26. An arrangement as in claim 21, wherein each soft-shutdown circuit includes an under-voltage detection circuit connected to another input of the OR gate so that hard-shutdown logic may be initiated upon detection of an under-voltage.

* * * * *